United States Patent [19]

Lockard

[11] 4,247,864
[45] Jan. 27, 1981

[54] LIGHT EMITTING DIODE ASSEMBLY

[75] Inventor: Joseph L. Lockard, Harrisburg, Pa.

[73] Assignee: AMP Incorporated, Harrisburg, Pa.

[21] Appl. No.: 883,559

[22] Filed: Mar. 6, 1978

Related U.S. Application Data

[63] Continuation-in-part of Ser. No. 816,423, Jul. 18, 1977, abandoned.

[51] Int. Cl.$^2$ .......................................... H01L 23/42
[52] U.S. Cl. .................................... 357/79; 357/68; 357/70
[58] Field of Search ........................ 357/79, 70, 68

[56] References Cited

U.S. PATENT DOCUMENTS

| | | | |
|---|---|---|---|
| 3,500,136 | 3/1970 | Fischer | 357/79 |
| 3,702,954 | 11/1972 | Mosch et al. | 357/79 |
| 3,708,730 | 1/1973 | Schierz et al. | 357/79 |
| 3,916,433 | 10/1975 | Schierz | 357/79 |

Primary Examiner—Edward J. Wojciechowicz
Attorney, Agent, or Firm—Gerald K. Kita

[57] ABSTRACT

Light emitting diodes are mounted in an assembly of electrical leads and lenses, the leads having a common carrier strip attached thereto and pairs of resilient contact fingers, the diodes being resiliently gripped between pairs of contact fingers and then encapsulated in a light transmitting material which itself forms a diffusing lens; a separate lens alternatively being provided by a rigid outer shell of light transmitting material.

6 Claims, 16 Drawing Figures

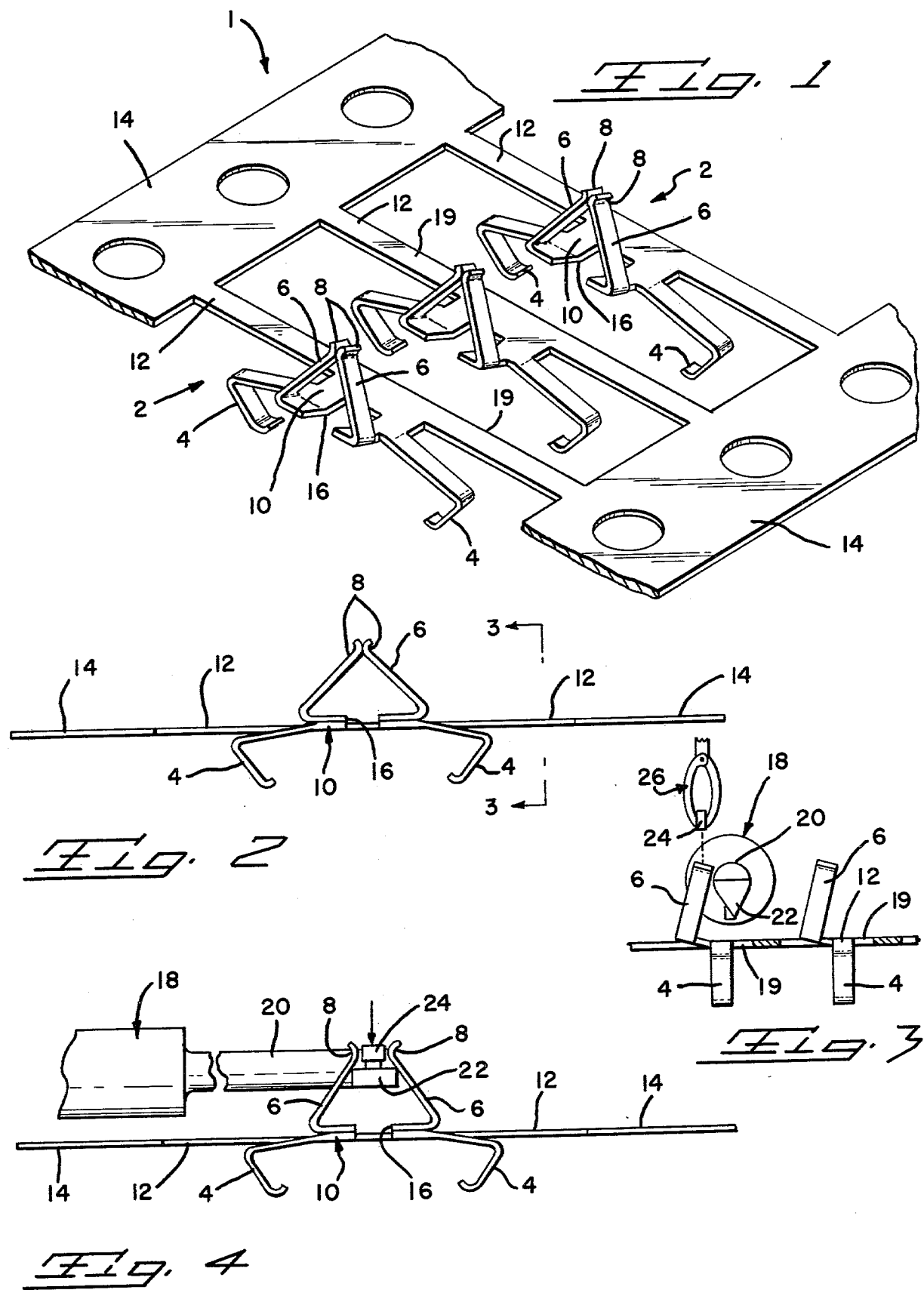

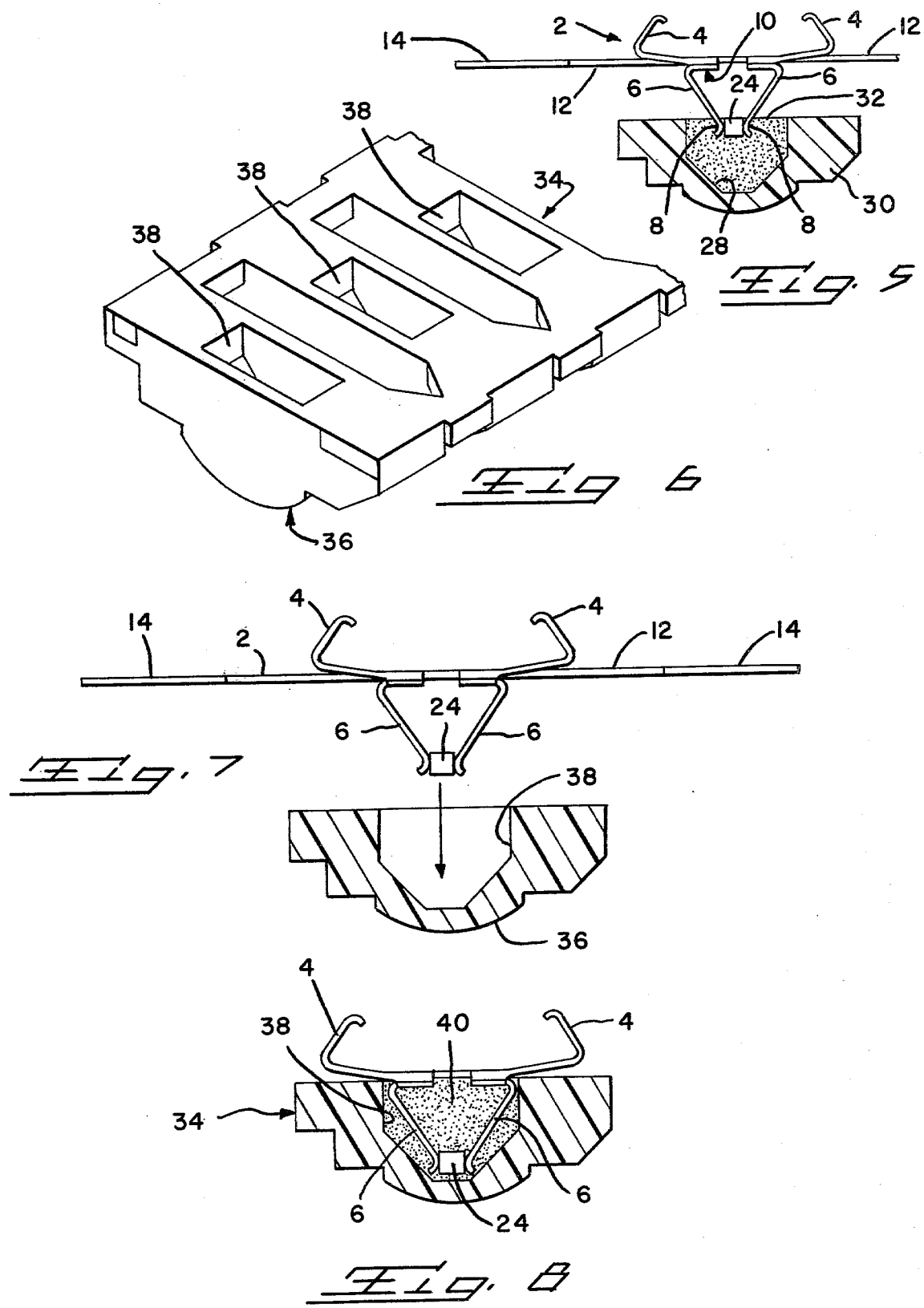

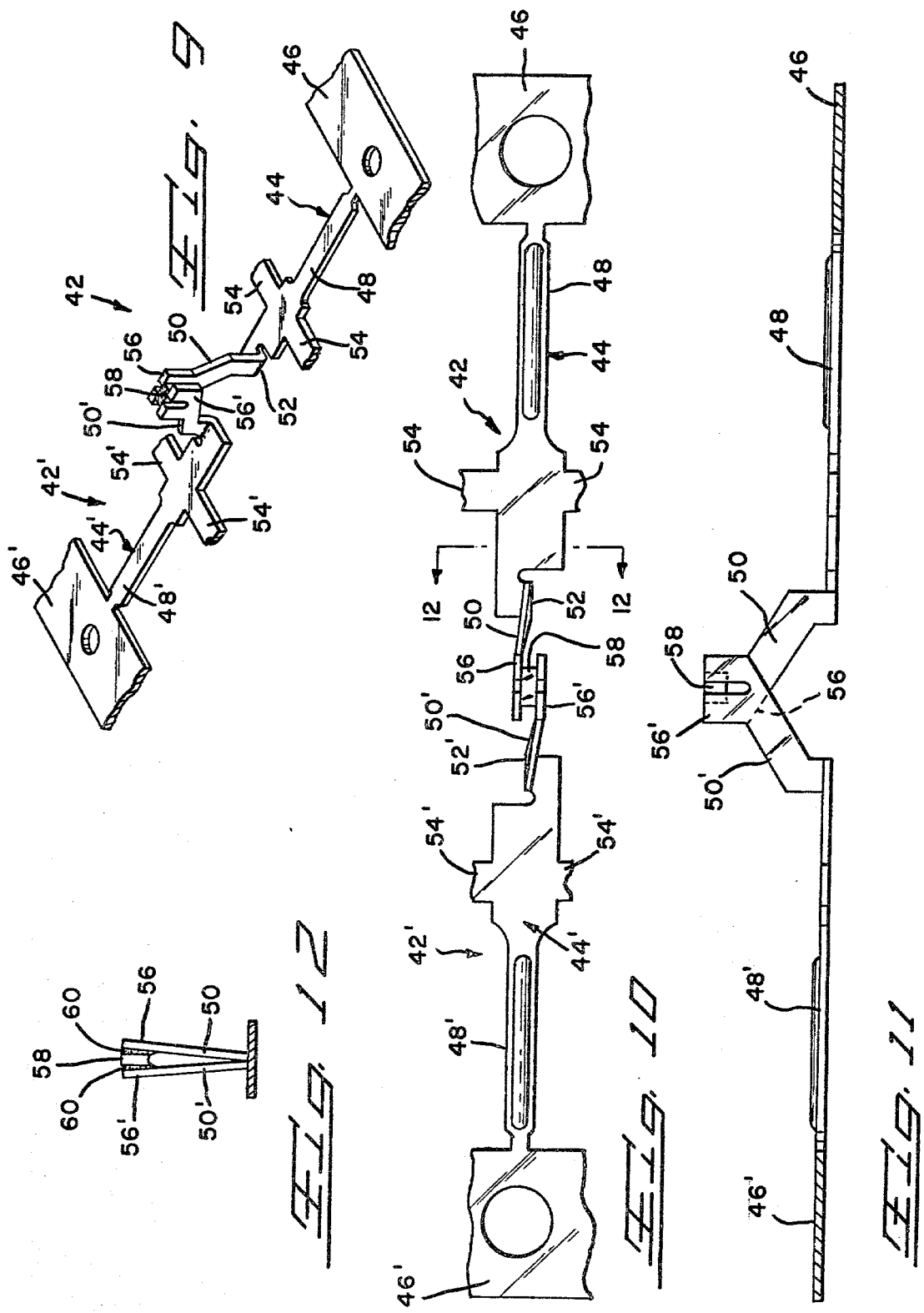

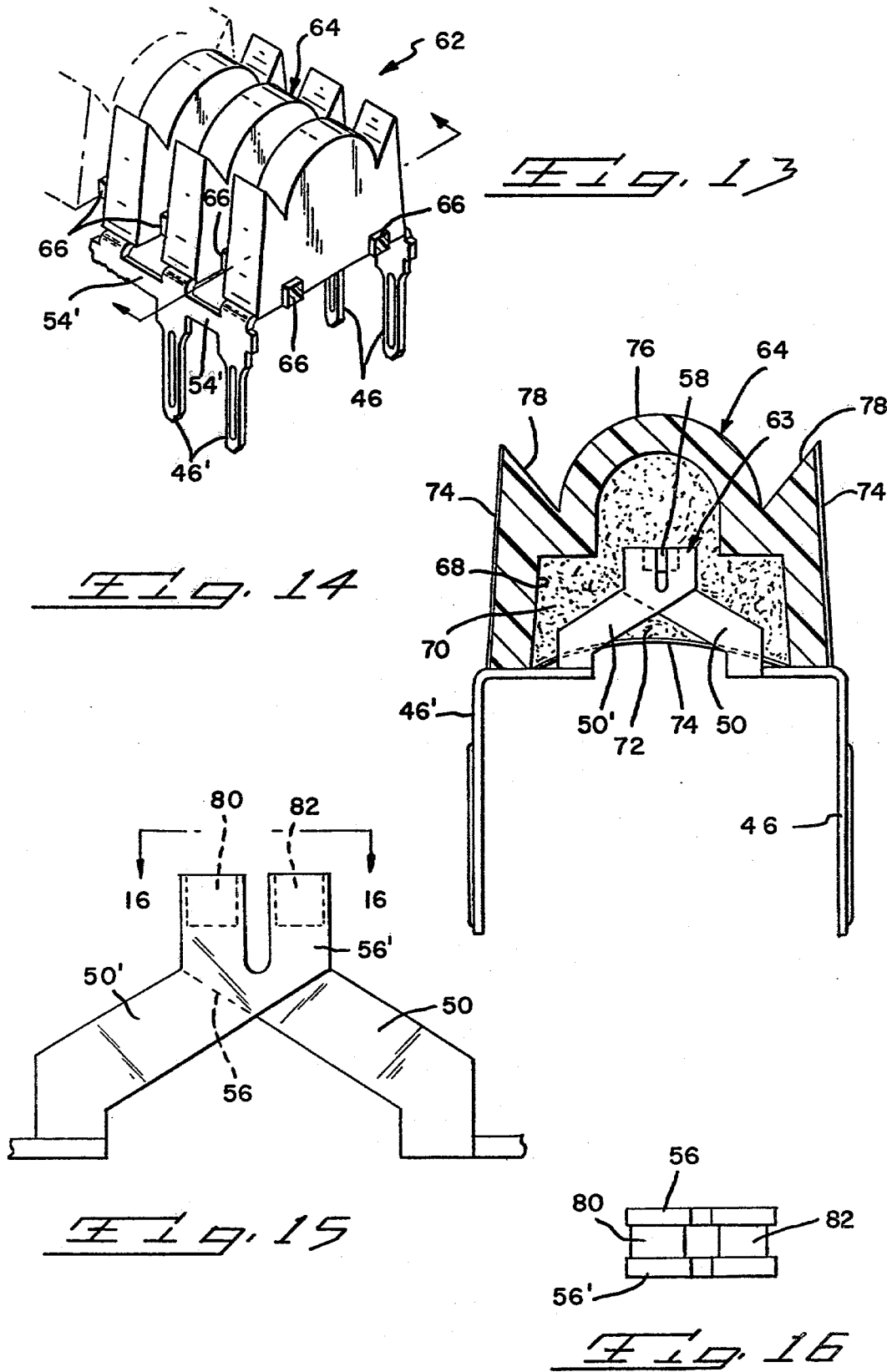

LIGHT EMITTING DIODE ASSEMBLY

CROSS REFERENCE TO RELATED APPLICATION

This application is a continuation-in-part of application Ser. No. 816,423, filed July 18, 1977, now abandoned.

BACKGROUND OF THE PRIOR ART

U.S. Pat. No. 4,012,608 is representative of the prior art wherein a light emitting diode is provided with electrical leads for incorporation into an electrical circuit component of miniature size such as a manually actuated switch. The diode is incorporated into the electrical circuit of the switch by slender and delicate electrical leads which are bonded to the diode. A more rugged diode connection is taught in U.S. Pat. No. 3,999,287 wherein the diode leads are comprised of resilient metal strips. A diode is press fit between the metal strips and then encapsulated in place. The present invention relates to an improved structure and method providing a diode assembly.

BRIEF DESCRIPTION

The present invention relates to light emitting diode (LED), assemblies, and more specifically, to assembly of light emitting diodes with lenses and electrical leads. A series of stamped and formed electrical leads are provided along a carrier strip. The leads include resilient fingers which project outwardly of the plane of the carrier strip. The fingers are resiliently deflected to spread apart configurations. Properly oriented LED's are positioned between the fingers. Subsequently, the fingers resiliently grip opposite sides of the diodes, making electrical connections therewith, and positioning the diodes in a plane elevated from the carrier strip. The diodes, together with at least portions of the fingers, are encapsulated in a solidifiable and light transmitting material advantageously molded into a desired lens configuration. Alternatively, the diodes may be located in corresponding cavities of a rigid shell of light transmitting material. The diodes are then encapsulated with a light transmitting encapsulant which also fills the cavity of the lens shell. What results is a series of encapsulated diodes arranged in strip form already provided with light diffusing lenses and electrical leads. The diode assemblies then are capable of separation from the carrier strip individually or in groups for incorporation within an electrical circuit, the leads being advantageously used as solderable tabs or pluggable electrical leads.

The encapsulant is provided with a concave outer surface which is covered or coated with a reflective material such as paint containing titanium oxide. Light emission from the LED in the encapsulant is retroreflected thereby. If the encapsulant, or the outer lens, includes a convex outer surface, by viewing the light emission through such surface, the retroreflected light, combined with the remainder of light emission, will become magnified when emitted through the surface to appear unusually bright.

In another form of the invention, the finger portions project from one side of the carrier strip and are bent outwardly of the plane of the carrier strip. Two sections of carrier strip are positioned so that the fingers of one strip partially overlap corresponding fingers of the other strip. The fingers are resilient and thereby tend to spring back a slight amount toward the plane of the carrier strip after being bent. This action biases the overlapping portions of the fingers toward each other into gripped engagement on a diode.

According to another embodiment of the invention a pair of diodes are engaged by and between a pair of electrical leads, each lead being an anode for one diode and a cathode for the other diode. If the diodes are LED's which emit light of different colors, the polarity of voltage impressed across the lead is indicated by the corresponding color emitted by the conducting LED.

OBJECTS

It is therefore an object of the present invention to provide a diode mounting assembly comprising a series of electrical conducting contacts having resilient fingers and electrical leads, the fingers being resiliently biased apart to receive diodes therebetween, the fingers resiliently gripping opposite sides of the diodes in elevated positions suitable for encapsulation in a light transmitting encapsulant material.

Another object of the present invention is to provide a method for fabricating a light emitting diode assembly by providing a series of stamped and formed electrical leads having resilient finger portions which grip diodes inserted between pairs of the fingers, the gripped diodes being encapsulated together with portions of said fingers in a light transmitting encapsulant material, alternatively provided with a rigid light transmitting lens.

Another object of the present invention is to provide an assembly wherein two LED's having light emissions of different colors are connected between a pair of electrical leads, the color of light emitted by the conducting LED indicating polarity of a voltage impressed across the leads.

Other objects and many attendant advantages of the present invention will become apparent from the following detailed description taken in conjunction with the accompanying drawings.

BRIEF DESCRIPTION OF THE DRAWINGS

FIG. 1 is an enlarged fragmentary perspective of a series of electrical contacts mounted along a pair of common carrier strips particularly illustrating the contacts as having projecting pairs of resilient finger portions;

FIG. 2 is an enlarged front elevation of a typical lead assembly of FIG. 1 showing depending leads and elevating resilient fingers inclined toward each other.

FIG. 3 is an enlarged fragmentary side elevation of the embodiment of FIG. 2 taken along the line A—A.

FIG. 4 is a view similar to FIG. 2 illustrating diode insertion between pairs of fingers.

FIG. 5 is an enlarged elevation of the embodiment shown in FIG. 4 with the inserted diode being inverted and encapsulated in a light transmitting material.

FIG. 6 is an enlarged fragmentary perspective of a lens shell having a series of individual lenses connected integrally together and provided with a series of cavities.

FIG. 7 is an enlarged elevation of the embodiment shown in FIG. 4 with the inserted diode inverted and received in a corresponding cavity of the lens shell illustrated in FIG. 6.

FIG. 8 is an enlarged front elevation in section of an alternative diode assembly wherein a diode together with the gripping fingers are encapsulated in a light transmitting material which in turn fills a cavity of the lens shell.

FIG. 9 is an enlarged fragmentary perspective of another embodiment of electrical contacts.

FIG. 10 is an enlarged fragmentary plan of the embodiment illustrated in FIG. 9.

FIG. 11 is an enlarged fragmentary elevation in section of the embodiment as shown in FIG. 10.

FIG. 12 is a section taken along the line 12—12 of FIG. 10.

FIG. 13 is an enlarged fragmentary perspective of another embodiment of a LED assembly incorporating the contacts of FIG. 9 in an outer shell.

FIG. 14 is a section taken along the line 14—14 of FIG. 13.

FIG. 15 is an enlarged fragmentary elevation of a polarity indicating LED assembly.

FIG. 16 is a fragmentary plan taken along the line 16—16 of FIG. 15.

DETAILED DESCRIPTION

With more particular reference to the drawings, there is shown in FIG. 1 generally at 1 a preferred embodiment of a diode mounting framework comprising a series of electrical contacts 2 which are stamped and formed out of metal strip and which include corresponding pairs of depending electrical leads 4 integral with corresponding pairs of vertically projecting resilient electrical contact fingers 6. The contact fingers are arranged in opposed pairs with opposed fingers being inclined toward each other. The free ends 8 of the contact fingers are arcuately bowed or flared away from each other. The other ends of the fingers are connected to web portions 10 which project laterally from interconnecting and integral strips 12. The strips 12 connect corresponding contacts 2 integrally with carrier strips 14, along with the series of contacts 2 are arranged in serial fashion. Each of the webs 10 is provided with a lateral opening 16 which passes under opposed contact fingers 6 and which separates the lower ends of the fingers 6 from each other. Each opening 16 also is interposed between corresponding pairs of leads 4 separating them from each other.

With reference to FIGS. 3 and 4, insertion of the diodes will be described in detail. Each corresponding pair of fingers 6 project vertically outward from the common plane of the carrier strips 14 and are spaced apart to define a triangular shaped opening or clearance therebetween. Each pair of fingers 6 are also inclined from the vertical as shown in FIG. 3. A toolhead is shown schematically at 18. The toolhead includes a projecting shaft 20 which carries an eccentrically mounted cam lobe 22. The tool is slidably advanced along and in registration against an edge margin 19 of the strip 12 that extends from one carrier strip 14 to the other, thereby to position the cam lobe 22 in the opening or clearance between a corresponding pair of fingers 6. As shown in FIG. 4, the initial position of the lobe 22 is vertically below the shaft 20. The lobe is then pivoted about the shaft to its position vertically above the shaft 20 where it engages the undersides of both fingers 6, spreading apart the free ends 8 thereof. More particularly, the arms 6 are resiliently deflected away from each other by the cam lobe 22. This allows for receipt of an LED chip 24 between the spread apart free ends 8. Insertion of the LED is accomplished by a pincer type toolhead 26. The LED 24 is fully inserted when placed in registration against the top surface of the cam lobe 22 as shown in FIG. 4. Subsequently, the cam lobe 22 is pivoted to its FIG. 3 outline position disengaged from the fingers 6 allowing them to resiliently deflect by residual spring action toward each other whereby the free ends 8 grippingly engage opposite sides of the inserted diode 24 making electrical contact therewith and mounting the diode to the electrical contact 2. The diode may then be released by the toolhead 18. In practice, the toolhead 26 and the toolhead 18 are components of an assembly machine which automatically actuates the cam lobe and insertion head in the sequence of insertion as described. Each corresponding pair of fingers 6 are indexed forwardly into position by proper indexing of the carrier strips 14, followed by repeated sequencing of the toolheads 26 and 18. Alternatively, multiple stations having toolheads 18 and 26 may be provided for multiple simultaneous LED insertion. What results is an array of diode assemblies serially located along the carrier strips 14 and comprising diode chips grippingly engaged between corresponding fingers 6.

FIG. 5 illustrates schematically encapsulation of the inserted LED's. More particularly, the LED's 24 are sufficiently gripped between corresponding fingers 6 to allow the assemblies to be inverted without dislodging the inserted LED's. The inverted LED's are then dipped or otherwise located within corresponding cavities 28 of a suitable mold 30. A quantity of a light transmitting encapsulant material 32 is then deposited in each mold cavity 28. Upon solidification of the encapsulant material, the LED 24, together with at least the portions 8 of the fingers 6, are encapsulated within corresponding globules of encapsulant. Upon removal of the solidified encapsulant globules from the mold 30, what results is a series of encapsulated LED's serially along the carrier strips 14, with the solidified encapsulation material 32 associated with each LED being molded to a desired shape and forming light diffusing lenses. The remainder of the fingers 6 and the leads 4 project from the encapsulant material to establish electrical connection points. The encapsulant may be of the type which solidifies, such as light transmissive epoxy, for example. Solidification of the encapsulant rigidly retains the contact fingers and the diodes in place, with the contact fingers retained in pressure contact with the diodes sufficient to establish pressure electrical connections. Removal of the carrier strips 14 and bridging members 12 allow isolation of individual diodes together with accompanying electrical leads 4.

FIGS. 6-8 illustrate another preferred embodiment according to the present invention. As shown in FIG. 6, a molded lens shell generally indicated at 34 is molded into the shape of a series of bulbous lenses 36 integrally connected together and provided with individual lens cavities 38 in each of the lenses 36. As shown in FIG. 7, the serial array of LED's 24 are shown inverted together with their carrier strips 14 and arms 6. The serial array of LED's 24 are located within corresponding serial arrayed lens cavities 38 and a quantity of light transmitting encapsulant material 40 is deposited within each of the cavities 38. Upon solidification of the encapsulant material 40 of the LED's 24 together with at least portions of the arms 6 are encapsulated within the shell 34. The shell 34 thus provides the desired lens shape for the LED's 24. A multiple number of LED's 24 may be provided in the lens shell 34. Alternatively, the shell 34 may be divided as desired to provide individual ones, or any selected number of LED's in a single lens assembly wherein each of the LED's 24 is provided with electrical leads 4 which project outwardly of the lens shell for pluggable or solderable connection of the LED's to circuitry.

FIGS. 9-12 illustrate another embodiment of a diode mounting framework generally illustrated at 42 and comprising a series of electrical contacts 44 which are stamped and formed out of the strip and which project laterally from a common integral carrier strip 46. Each of the contacts 44 includes an electrical lead 48 frangibly connected to the strip 46. Each contact 44 further includes a resilient electrical contact finger 50 which is bent at 52 to project outwardly of the plane of the metal strip from which the carrier strip 46 and contacts 44 are fabricated. Each contact finger portion 50 is interconnected to adjacent finger portions 50 by integral support strips 54 which extend generally parallel to the carrier strip 46. As shown in FIGS. 9 and 10, another section of a diode mounting framework is illustrated at 42' identical to the section of framework illustrated at 42. The framework section 42' includes a carrier strip 46' from which project integral contacts 44' having the corresponding electrical leads 48', the contact finger portions 50', and the auxiliary support strips 54'. The strip sections 46 and 46' are positioned opposite each other as shown such that each contact finger portion 50 overlaps a corresponding contact finger portion 50'. More particularly, the free end of each contact finger 50 includes a metal plate portion 56 overlapping, in side-by-side relationship, a similar plate portion 56' provided at the free end of a contact finger portion 50'. The finger portions 50 and 50' are fabricated from resilient metal strip and thereby tend to return to the plane of the corresponding strip 46 and 46' after being bent at 52 and 52'. This return action, or spring back action, resiliently biases the plate portions 56 and 56' toward each other in order to resiliently engage on either side of at least one diode or LED 58 sandwiched between the plate portions 56 and 56'.

To insert one or more of the diodes 58, the carrier strip sections 46 and 46' are placed upon a fixture (not shown) and adjusted in position on the fixture until the plate portions 56 and 56' are in desired overlapped alignment and are positioned, either in compression against each other, or spaced apart with a small clearance as desired. The strip sections 46 and 46' may be then clamped by any suitable clamping apparatus to the fixture. Suitable insertion heads, such as used in the previously described embodiment, are provided to bias apart the plate portions 56 and 56', and to insert at least one diode 58 therebetween. Such insertion heads may be of the type previously described with respect to the embodiment shown in FIGS. 3 and 4. The plate portions 56 and 56' will resiliently engage the inserted LED 58. Subsequently, solder may be applied to solder the LED 58 to each of the plate portions 56 and 56'. It is, however, more advantageous to coat the plate portions 56 and 56' with a quantity of adhered solder prior to assembly on the fixture as described. As shown in FIG. 12, such a solder coating 60 will electrically secure the diode 52 to the plate portions 56 and 56' when the solder is, first, reflowed upon the application of heat and subsequently, when cooled, the solder coating 60 will solidify and permanently secure the contacts 56 and 56' to opposite sides of the diode 58. Thereby, the contacts 56 and 56' provide an anode and cathode connection for the diode 58. What results is a series of LED assemblies 63 arranged serially like rungs of a ladder interconnected between the strip sections 46 and 46'.

FIGS. 13 and 14 illustrate a molded lens shell illustrated generally at 62, molded into a series of individual bulbous lenses 64 which are spaced apart and interconnected by pairs of molded webs 66. Lenses 64 are spaced apart a distance equal to the LED assemblies 63 spaced along the carrier strip sections 46 and 46'. Each LED assembly 63 is received within an internal cavity 68 of a corresponding lens 64 as shown in FIG. 14. Each cavity 68 is then at least partially filled with a light transmitting encapsulant material 70 which is subsequently solidified to embed the LED 58 and portions of the contacts 50' and 50 within the cavity 68. The lead portions 46 and 46' project outwardly of the encapsulant material in the lens cavity 68 to establish solderable tabs or pluggable electrical leads. The leads 46 and 46' may be bent to any desired orientation. The auxiliary strip portions 54 and 54' may be cut away and removed. Similarly, the web portions 56 may be severed or removed to separate an individual LED assembly 63 together with the corresponding lens 64.

As shown in FIG. 14, the encapsulant material 70 is provided with a concave exterior surface 72 which is covered or coated by a reflective material such as paint containing titanium oxide. As a result, a retroreflective surface is provided which appears convex to the diode 58 and to the light emissions from the diode. The retroreflected emissions are transmitted back through the encapsulant and are seen by viewing the lens through a convex outer surface 76 of the lens. The diode thereby is positioned between the surfaces 72 and 76.

The surface 76 is flanked on either side by diagonally projecting surfaces 78 which generally radially intersect the convex surface 76. The surfaces 78 provide additional retroflective surfaces for the LED light emissions and tend to conform or diffuse the light emissions into a broad area stripe configuration distributed arcuately along the convex outer surface 76. This avoids the tendency of the light emissions to appear as a pinpoint. Also, the use of a frosted lens is avoided which would tend to reduce the intensity of the light. The retroreflective surface 74 tends to magnify the retroreflected light as well as the remainder of the light emitted from the diode such that the stripe of light emissions along the convex surface 76 appears unusually bright.

FIGS. 15 and 16 illustrate another preferred embodiment according to the present invention whereby a pair of LED's 80 and 82 are sandwiched between overlapping portions 56 and 56' of a corresponding pair of contact fingers 50 and 50'. The diodes 80 and 82 are electrically connected to the contact portions 56 and 56', for example, in a manner as described with respect to FIG. 12. The diodes 80 and 82 are oriented such that each of the contact portions 56 and 56' is an anode lead for one of the diodes and a cathode lead for the other diode. Thus a voltage of a given polarity which is impressed across the contact portions 56 and 56' will light only one of the LED's. Similarly, an impressed voltage of an opposite polarity will light only the other LED. If the LED's 80 and 82 emit light of different colors, the polarity of the voltage impressed across the contact portions 56 and 56' will be indicated by the corresponding color emitted by the only conducting LED.

What has been shown and described are preferred embodiments of the present invention. Other embodiments and modifications of the invention which would be apparent to one having ordinary skill in the art is intended to be covered by the spirit and scope of the appended claims.

What is claimed is:

1. A diode mounting assembly, comprising:
    first and second conductive carrier strips, each having a projecting series of electrically conducting contacts bent outwardly of the plane of a respective carrier strip, with portions of the series of said contacts overlapping corresponding portions of the series of said contacts on the other carrier strip to define cooperating pairs of resilient gripping fingers adapted for engaging and gripping opposite sides of miniature electronic circuit devices, and
    with said devices being supported by cooperating pairs of said fingers in positions outwardly of the plane of each said carrier strip and in alignment with clearance spaces defined between said carrier strip and between cooperating pairs of said fingers, so that said devices are exposed for access thereto from directions across the plane of each said carrier strips.

2. The structure as recited in claim 1, wherein, said carrier strips are interconnected by metal strip portions having web portions connected to cooperating pairs of said fingers, said web portions having openings therethrough in alignment with said clearance spaces.

3. The structure as recited in claim 2, wherein, said webs include pairs of depending electrical lead portions.

4. The structure as recited in claim 1, wherein, said carrier strips are adjustable with respect to each other to adjust the overlapped portions of said cooperating pairs of said contacts, either in compression with each other or spaced apart with small clearances, to accommodate gripping of said devices.

5. The structure as recited in claim 4, wherein, said contacts tend to return resiliently toward the plane of a corresponding said carrier strip after being bent, providing a resilient spring action biasing said overlapping portions of cooperating pairs of said contacts toward each other.

6. The structure as recited in claim 1, wherein, said contacts tend to return resiliently toward the plane of a corresponding said carrier strip after being bent, providing a resilient spring action biasing said overlapping portions of cooperating pairs of said contacts toward each other.

* * * * *